United States Patent [19]

Becker et al.

[11] Patent Number: 4,983,945

[45] Date of Patent: Jan. 8, 1991

[54] DEVICE FOR DETECTING MAGNETIZED AREAS

[75] Inventors: Helmut Becker, Nuremberg; Armin G. Kissling, Rosstal, both of Fed. Rep. of Germany

[73] Assignee: Alcatel N.V., Amsterdam, Netherlands

[21] Appl. No.: 315,577

[22] Filed: Feb. 27, 1989

[30] Foreign Application Priority Data

Mar. 3, 1988 [DE] Fed. Rep. of Germany ....... 3806808

[51] Int. Cl.⁵ .............................................. H01L 43/00
[52] U.S. Cl. .................................. 338/32 R; 360/113
[58] Field of Search .................. 338/32 R, 325.7; 360/113

[56] References Cited

U.S. PATENT DOCUMENTS 4,413,296 11/1983 Jeffers .................................. 360/113
4,644,430 2/1987 French ................................. 360/113

OTHER PUBLICATIONS

U. Dibbern und A. J. Petersen bearbeitet von C.-H. Kramp, "Magnetoresistive Sensoren," Elektronik Wir bauen die Elemente Valvo, Technische Information 840323, 1984.

von Dibbern, U. et al., "Magnetoresistive Sensoren," Elektronik. Wir bauen die Elemente. VALVO, Mar. 23, 1984.

Primary Examiner—C. L. Albritton
Attorney, Agent, or Firm—Spencer & Frank

[57] ABSTRACT

A magnetic field can be detected by moving magnetized areas past a magnetoresistor, which responds to the changing magnetic field. The sensitivity to magnetic fields is limited by the width of the magnetoresistors used. To optimize the sensitivity, two spaced-apart ferromagnetic pole pieces (6, 7) are so disposed between the magnetoresistor and the magnetized areas that their ends (8, 9) at the magnetoresistor (4) form a first gap (10) having a width (11) on the order of the width (12) of the magnetoresistor (4), and that their ends (13, 14) at the magnetized areas form a second, considerably narrower gap (16).

16 Claims, 1 Drawing Sheet

DEVICE FOR DETECTING MAGNETIZED AREAS

BACKGROUND OF THE INVENTION

The present invention relates to a device for detecting magnetized areas of an object, and including a magneto resistor in strip form.

Such magnetic field detectors and sensors for magnetic field detectors are described in a printed publication of Wir Bauen die Elektronik Elemente VALVO, Technische Information #840323 entitled "Magnetoresistive Sensoren". In the prior art devices, the presence of a magnetized area is detected by the change in the resistance value of a magnetoresistor acted upon by the magnetic field of a magnetized area. The resistance change can be displayed and/or can be used for control purposes. The sensitivity of the magnetoresistor is dependent on the geometries of the magnetoresistor and the magnetized area.

The technical problem underlying the invention is the need to provide a magnetoresistive device for detecting magnetized areas which is so designed that the sensitivity of the magnetoresistor is always optimal independently of the geometry of the magnetized area.

SUMMARY OF THE INVENTION

This problem is solved by the provision of two spaced apart pole pieces of ferromagnetic material disposed between the magnetoresistor and the magnetized area to be detected. The pole pieces are disposed in such a manner that a first end of each pole piece faces the magnetoresistor and the first ends are spaced apart by a first gap having a width approximately equal to the width of the magnetoresistor, and the pole pieces have respective second ends remote from the magnetoresistor and spaced apart by a gap within the order of magnitude of the width of a magnetized area to be detected. Further, the pole pieces are configured so that the distance between the pole pieces in a section of the pole pieces between the first and second ends is greater than the distance between the pole pieces at the gaps. In the solution according to the invention, all parts of the device, namely the magnetoresistor, the position and size of the gap formed by the pole pieces near the magnetoresistor, and the position and size of the gap at the magnetized area, can be optimized independently.

Further advantageous features of the invention will be apparent to the skilled artisan from the disclosure of the present invention.

BRIEF DESCRIPTION OF THE DRAWINGS

The invention will now be described with the aid of the embodiment illustrated in the accompanying drawings, in which.

DETAILED DESCRIPTION OF PREFERRED EMBODIMENTS

Figure 1:
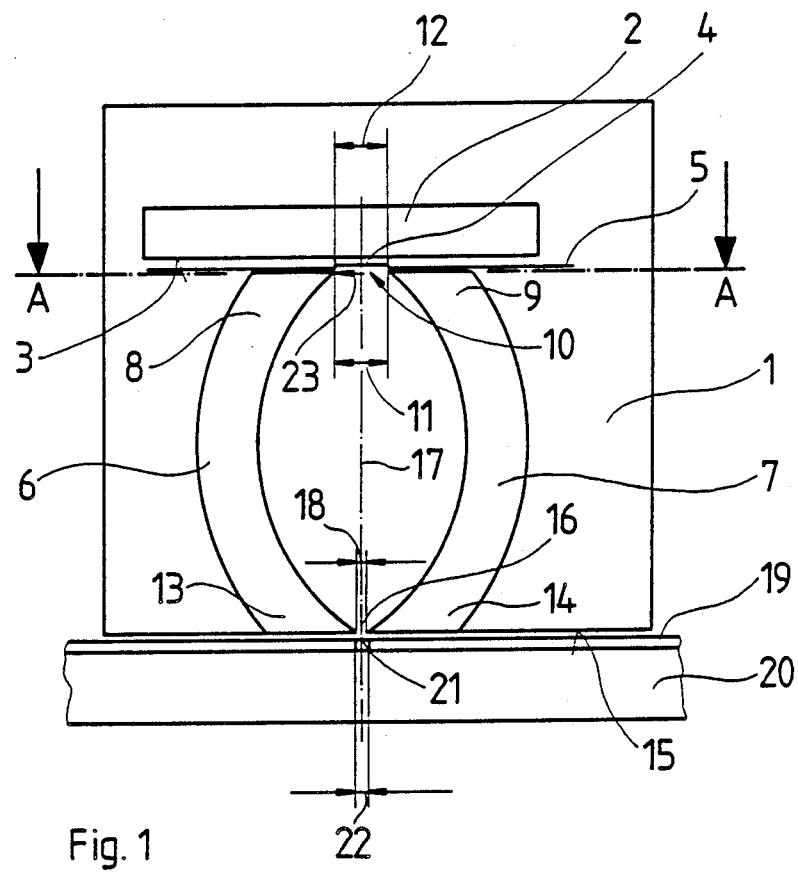
FIG. 1 is a top planar view of a magnetic field detector according to the invention.

As can be seen in FIG. 1, an insulating block 1, made of synthetic resin, for example, contains an insulating substrate 2 of glass, ceramic or plastic, on whose surface 3, in FIG. 1 the lower surface, a magnetoresistor 4 is deposited in stripe form. The stripes of the magnetoresistor extend perpendicular to the plane of the paper. The lines of force of the magnetic field acting on the magnetoresistor lie in the gap 10 between the ends of two pole pieces 6, 7 of ferromagnetic material disposed beside the magnetoresistor 4.

The magnetoresistor 4 and/or the entire surface 3 of the substrate 3 is covered with an insulating sheet 5, whose thickness should be 10 to 50 $\mu$m, preferably 20 to 30 $\mu$m.

Figures 2, 3:
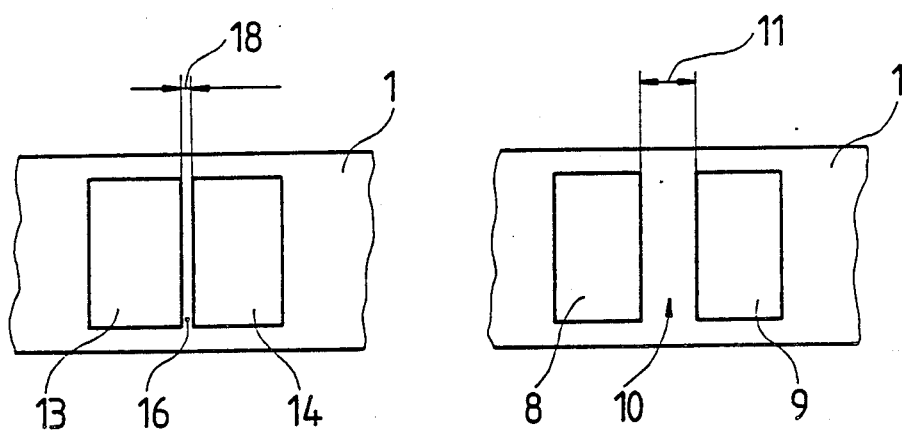
FIG. 2 is a partial front view of the magnetic field detector of FIG. 1.
FIG. 3 is a cross-sectional view taken along line A—A of FIG. 1.

At the surface 3, the two pole pieces 6 and 7 of ferromagnetic material, whose ends 8 and 9 are face-ground parallel to the surface 3, are disposed beside the magnetoresistor 4. The space between the ends 8, 9 forms the first gap 10. Its width 11 is of the order of the width 12 of the magnetoresistor 4. It is between 50 and 300 $\mu$m, preferably about 150 $\mu$m. The form of the gap 10 is apparent from FIG. 3

The pole pieces 6, 7 are arched in such a way that at the front 15 of the insulating block 1, the ends 13, 14 of the pole pieces 6, 7 remote from the substrate 2 approach each other again. There they form a second gap 16. Through the arched shape of the pole pieces 6, 7, the distance between the pole pieces 6, 7 outside the areas of the gaps 10 and 16 is a multiple of the widths 11 and 18 of the gaps 10 and 16, respectively. A stray magnetic field between the pole pieces 6, 7 is thus largely avoided. The ends 13, 14 at the front 15 should be face-ground, but it is not absolutely necessary for the surfaces of the ends 13, 14 to be flat. The same applies to the ends 8 and 9. The front 15 should be plane-parallel to the surface 3 of the substrate 2.

The width 18 of the second gap 16 is considerably less than the width 11 of the first gap 10. The width of the gap 16 is about 1 to 100 $\mu$m, preferably 40 to 50 $\mu$m. The form of the gap 16 is apparent from FIG. 2.

In operation, a nonferromagnetic support 20 provided with a magnetizable layer 19, for example, is moved past the front 15. The magnetizable layer 19 is provided with a plurality of magnetized areas 21 whose width 22 may be as small as the width 18 of the second gap 16. Even with such small dimensions of the magnetized areas 21, a strong enough magnetic field 23 to change the resistance of the magnetoresistor 4 will be present at the first gap 10. With an electronic circuit, a signal can be derived from the resistance change of magnetoresistor 4 which can be used for indication and control purposes.

The magnetized areas may be in the form of a bar code of permanent-magnet material on a card of nonferromagnetic material. They may also be arranged on a disk.

We claim:

1. Device for detecting magnetized areas of an object, comprising:

a magnetoresistor in stripe form and having a given width; and two spaced-apart pole pieces of ferromagnetic material disposed between the magnetoresistor and a magnetized area to be detected, each pole piece having a first end facing the magnetoresistor, said first ends being spaced apart by a first gap having a width approximately equal to the width of the magnetoresistor, each pole piece having a second end remote from the magnetoresistor, said second ends being spaced apart by a second gap having a width narrower than the first gap on the order of magnitude of the width of the magnetized area, the distance between the pole pieces outside the gaps between said first and second ends being much greater than that at the gaps;

wherein the ends of the pole pieces are faced-ground in planes perpendicular to a connecting line between the two gaps, and said pole pieces extend inclined toward the second gap such that they taper to form acutely-angled inside edges at the second gap.

2. A device as claimed in claim 1, wherein said pole pieces are bent outwardly relative to each other.

3. A device as claimed in claim 1, further including a plastic block in which the magnetoresistor and the pole pieces are molded, said plastic block being face-ground at the second ends of the pole pieces facing the magnetized areas.

4. A device as claimed in claim 1, wherein the width of the second gap is 1 to 100 μm.

5. A device as claimed in claim 1, wherein the width of the first gap is 50 to 300 μm.

6. Device for detecting magnetized areas of an object, comprising:

a magnetoresistor in stripe form and having a given width; and two spaced-apart pole pieces of ferromagnetic material disposed between the magnetoresistor and the magnetized area, each pole piece having a first end facing the magnetoresistor, said first ends being spaced apart by a first gap having a width approximately equal to the width of the magnetoresistor, each pole piece having a second end remote from the magnetoresistor, said second ends being spaced apart by a second gap having a width on the order of magnitude of the width of the magnetized area, the distance between the pole pieces outside the gaps between said first and second ends being much greater than that at the gaps, further including an insulating sheet separating the pole pieces from the magnetoresistor.

7. A device as claimed in claim 6, wherein the insulating sheet has a thickness of 10 to 50 μm.

8. A device as claimed in claim 1, wherein the width of said second gap is approximately 50 μm.

9. A device as claimed in claim 1, wherein the width of said first gap is approximately 150 μm.

10. A device as claimed in claim 6, wherein said insulating sheet has a thickness of 20 to 30 μm.

11. A device as claimed in claim 1, wherein: the width of said second gap is 1 to 100 μm, and the width of said first gap is 50 to 300 μm.

12. A device according to claim 1, wherein the width of said first gap is at least twice the width of said second gap.

13. A device for detecting magnetized areas of an object, comprising:

a strip-shaped magnetoresistor of a predetermined width;

two spaced-apart pole pieces disposed symmetrically opposite each other between the magnetoresistor and a magnetized area to be detected, each of said pole pieces having first and second opposite parallel planar ends, the ends tapering to form acute angles at inside edges thereof, said first end of each pole piece being adjacent to and facing the magnetoresistor, and said second end of each pole piece being closest to and facing the magnetized area to be detected, said two pole pieces forming and being separated at their inside edges at said first ends by a first gap having a width approximately equal to the width of the magnetoresistor, and said two pole pieces forming and being separated at their inside edges at said second ends by a second gap, so that the two parallel planes formed by the pole piece ends are perpendicular to a line connecting the first and second gaps;

whereby field line concentration producing high field density and a large, dense scatter field in the region of the magnetoresistor is achieved, resulting in a highly sensitive device.

14. A device as claimed in claim 1, further including an insulating sheet separating the pole pieces from the magnetoresistor.

15. A device as claimed in claim 14, wherein the insulating sheet has a thickness of 10 to 50 μm.

16. A device as claimed in claim 14, wherein said insulating sheet has a thickness of 20 to 30 μm.

* * * * *